(12) United States Patent
Kawasaki et al.

(10) Patent No.: US 6,748,205 B1
(45) Date of Patent: Jun. 8, 2004

(54) INTEGRATED CIRCUIT

(75) Inventors: Somei Kawasaki, Urawa (JP); Masami Iseki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 485 days.

(21) Appl. No.: 09/703,010

(22) Filed: Oct. 31, 2000

(51) Int. Cl.[7] .......................... H04B 1/28; H03K 3/289; H03K 3/356; H03K 3/037

(52) U.S. Cl. ........................ 455/333; 327/203; 327/211; 327/215; 327/218

(58) Field of Search ................................. 455/333, 334, 455/14; 375/257; 327/215, 218, 203, 208, 210, 211

(56) References Cited

U.S. PATENT DOCUMENTS 5,905,369 A * 5/1999 Ishii et al. ................. 323/272
6,094,074 A * 7/2000 Chi et al. ................... 326/115

* cited by examiner

Primary Examiner—Vivian Chin
Assistant Examiner—Yuwen Pan
(74) Attorney, Agent, or Firm—Robin, Blecker & Daley (57) ABSTRACT

In an integrated circuit, a time-axis expanding circuit is provided in addition to a driver circuit for outputting a signal outside. The time-axis expanding circuit has an equivalent receiver circuit similar to an ordinary receiver circuit, and a D-type flip-flop circuit connected to the equivalent receiver circuit. Input signals from the pins of the time-axis expanding circuit are inputted to the gates of CMOS transistors of the equivalent receiver circuit, and equivalent differential receiving signals outputted from the drains of the CMOS transistors are inputted to the D input terminal of the D-type flip-flop circuit. A measuring clock signal is inputted to the clock input terminal of the D-type flip-flop circuit, and a time-axis-expanded signal is outputted from the Q output terminal of the D-type flip-flop circuit to an output terminal of the time-axis expanding circuit.

7 Claims, 6 Drawing Sheets

INTEGRATED CIRCUIT

BACKGROUND OF THE INVENTION

1. Field of the Invention

The present invention relates to an integrated circuit and an evaluation method for the integrated circuit. More particularly, the invention relates to an integrated circuit having a driver circuit for outputting a high-speed signal to the outside or a receiver circuit for receiving a high-speed signal from the outside, and to an evaluation method for the integrated circuit.

2. Description of Related Art

Signal transmission between integrated circuits is in a tendency toward higher-speed transmission along with the increase in the amount of information (data) to be transmitted. In addition, serial conversion transmission is tried to inhibit an increase in the number of transmission lines and the number of pins in an integrated circuit, and, therefore, the tendency toward higher-speed transmission is further accellerated.

Figure 1:
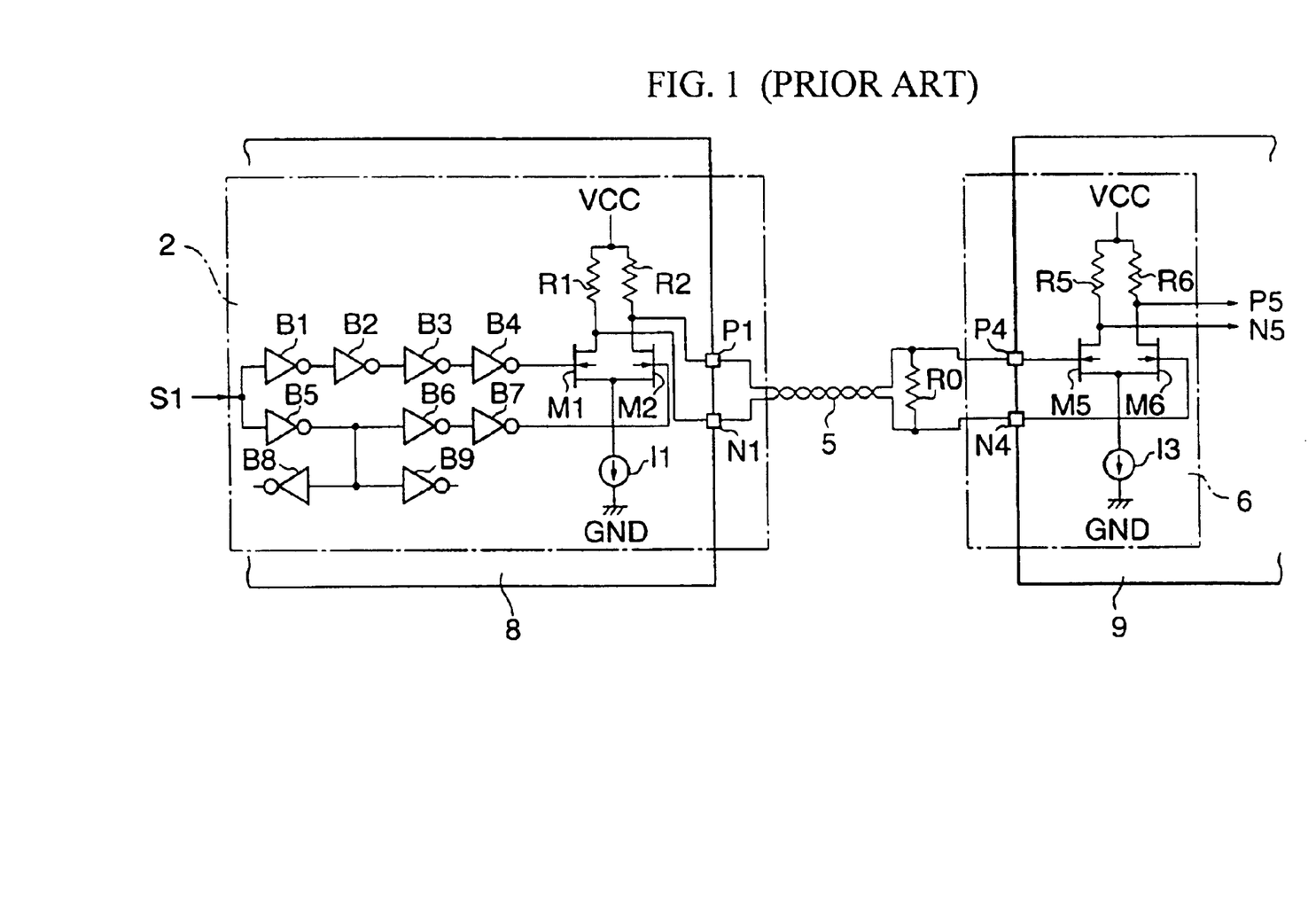
FIG. 1 is a circuit diagram illustrating a typical example of configuration for small-signal differential transmission performed by a conventional integrated circuit, which copes with high-speed transmission.

FIG. 1 illustrates a typical example of configuration of small-signal differential transmission based on a conventional integrated circuit, which copes with high-speed signal transmission of 1 Gbps (giga-bits/second). High-speed signal transmission is accomplished by a sending-side integrated circuit 8 including a driver circuit 2, a transmission line 5, a terminal resistor R0, and a receiving-side integrated circuit 9 including a receiver circuit 6.

Data S1 to be transmitted is converted into a differential signal by a differentiating circuit composed of inverters B1 to B9 in the driver circuit 2. A positive-polarity signal of the differential signal is inputted to the gate of a CMOS (complementary metal-oxide semiconductor) transistor M1, and a negative-polarity signal of the differential signal is inputted the gate of a CMOS transistor M2. The CMOS transistors M1 and M2 are source-coupled to each other, and a current I1 is supplied to the sources of the CMOS transistors M1 and M2. Resistors R1 and R2 are connected between the drains of the CMOS transistors M1 and M2 and a power supply VCC, respectively. The drains of the CMOS transistors M2 and M1 are connected to pins P1 and N1 of the integrated circuit 8, respectively, and high-speed signals (P1/N1) are outputted from the integrated circuit 8 via the pins P1 and N1.

The transmission line 5 is connected to the aforementioned pins P1 and N1. The receiving side of the transmission line 5 ends with the terminal resistor R0, and the signals (P1/N1) to be transmitted are connected to pins P4 and N4 of the receiving-side integrated circuit 9.

The signals (P4/N4) having passed through the pins P4 and N4 are inputted to the gates of CMOS transistors M5 and M6 in the receiver circuit 6, respectively. The CMOS transistors M5 and M6 are source-coupled to each other, and a current I3 is supplied to the sources of the CMOS transistors M5 and M6. Resistors R5 and R6 are connected between the drains of the CMOS transistors MS and M6 and a power supply VCC, respectively. Differential receiving signals are obtained at the drains of the CMOS transistors MS and M6. The differential receiving signals are outputted, as signals P5 and N5, to a signal processing circuit (not shown) in the integrated circuit 9 at such a voltage of about 0.5 Vpp as to facilitate handling in the CMOS transistor circuit.

A twisted-pair transmission line available at a relatively low cost is commonly used for the aforementioned transmission line 5. The characteristic impedance between lines of the twisted-pair transmission line is about 100 Ω. For the purpose of ensuring matching, the above-mentioned resistors R1 and R2 are set to 50 Ω, and the above-mentioned resistor R0 is set to 100 Ω. Further, since a transmission amplitude of about 0.3 Vpp is used, the current I1 is set to about 12 mA.

However, the conventional integrated circuit coping with high-speed signal transmission as described above has the following problems to be solved.

In order to confirm the transmission quality of a high-speed signal of 1 Gbps, the user of a particular integrated circuit is required to satisfy very difficult measuring conditions including the measuring device and probing. The particular integrated circuit must be guaranteed for accurate actions. For this purpose, the evaluation of the sending-side integrated circuit 8 and the receiving-side integrated circuit 9 in mass production thereof should be carried out under strict actual operating conditions. For example, the measurement of changes in data at intervals of 1 ns (nano-second) requires a high-accuracy measuring device under 100 ps (pico-second). An IC tester satisfying this function is expensive, so that IC shipping inspections have increased the cost of integrated circuits.

BRIEF SUMMARY OF THE INVENTION

It is an object of the present invention to provide an integrated circuit performing the sending and receiving of high-speed signals and an evaluation method therefor, which permit the achievement of simplified IC evaluation and the prevention of a cost increase of integrated circuits.

It is another object of the invention to provide an integrated circuit and an evaluation method therefor, which enable a user of integrated circuits to conduct stable and high-accuracy measurement without the need for an expensive measuring device and difficult probing, and in addition, make it possible for the user of integrated circuits to easily perform the optimization of a transmission line and a terminal resistor.

To attain the above objects of the invention, in accordance an aspect of the invention, there is provided an integrated circuit, which comprises a driver circuit for outputting a signal outside, a receiver circuit for receiving a signal from outside, and a time-axis expanding circuit for time-axis-expanding an output signal of the receiver circuit.

In accordance with another aspect of the invention, there is provided an integrated circuit, which comprises a receiver circuit for receiving a signal from outside, and a time-axis expanding circuit for time-axis-expanding an output signal of the receiver circuit.

In accordance with a further aspect of the invention, there is provided an evaluation method of evaluating a sending-side integrated circuit, the evaluation method comprising the steps of preparing an inspected integrated circuit including a first driver circuit for outputting a signal outside, a first receiver circuit for receiving a signal from outside, and a first time-axis expanding circuit for time-axis-expanding an output signal of the first receiver circuit, and an inspecting integrated circuit including a second driver circuit having the same configuration as that of the first driver circuit, a second receiver circuit having the same configuration as that of the first receiver circuit, and a second time-axis expanding circuit having the same configuration as that of the first time-axis expanding circuit, connecting the first driver circuit of the inspected integrated circuit to the second receiver circuit of the inspecting integrated circuit by a transmission line and a terminal resistor, inputting a signal to the first driver circuit of the inspected integrated circuit, and measuring a time-axis-expanded signal outputted from the second time-axis expanding circuit of the inspecting integrated circuit, on the basis of a measuring clock signal having a predetermined period, with a counter.

In accordance with a still further aspect of the invention, there is provided an evaluation method of evaluating a receiving-side integrated circuit, the evaluation method comprising the steps of preparing a driver circuit of an integrated circuit for outputting a signal outside, and an inspected integrated circuit including a receiver circuit for receiving a signal from outside, and a time-axis expanding circuit for time-axis-expanding an output signal of the receiver circuit, connecting the driver circuit to the receiver circuit of the inspected integrated circuit by a transmission line and a terminal resistor, inputting a signal to the driver circuit, and measuring a time-axis-expanded signal outputted from the time-axis expanding circuit of the inspected integrated circuit, on the basis of a measuring clock signal having a predetermined period, with a counter.

Since the invention provides configurations in which a time-axis expanding circuit including an equivalent receiver circuit is added to the sending-side integrated circuit, a time-axis expanding circuit using an output from the receiver circuit as an input is added to the receiving-side integrated circuit, and furthermore, each of the time-axis expanding circuits includes a D-type flip-flop circuit, it is possible to simplify the evaluation of ICs as described later.

The above and further objects and features of the invention will become apparent from the following detailed description of preferred embodiments thereof taken in connection with the accompanying drawings.

DETAILED DESCRIPTION OF THE INVENTION

Hereinafter, preferred embodiments of the present invention will be described in detail with reference to the drawings.

Sending-side Integrated Circuit

Figure 2:
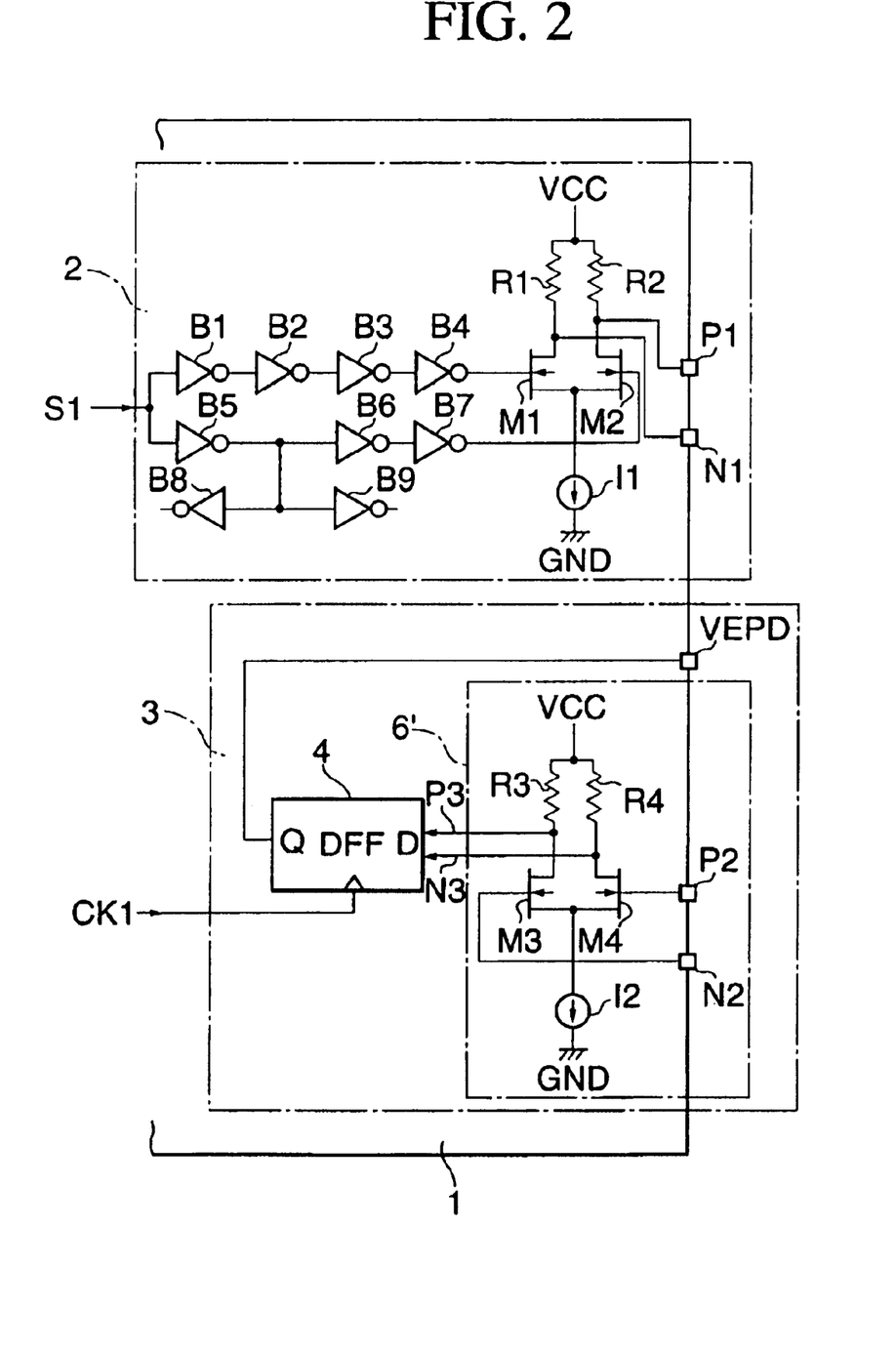
FIG. 2 is a circuit diagram showing the circuit configuration of a sending-side integrated circuit according to an embodiment of the invention.

FIG. 2 shows the circuit configuration of a sending-side integrated circuit 1 according to the embodiment of the invention.

First, the difference of the sending-side integrated circuit 1 from the conventional sending-side integrated circuit 8 shown in FIG. 1 will be described. In the sending-side integrated circuit 1 shown in FIG. 2, a time-axis expanding circuit 3 including an equivalent receiver circuit 6' is newly provided in addition to a driver circuit 2 having a configuration similar to that of the conventional one described in FIG. 1. The time-axis expanding circuit 3 has the equivalent receiver circuit 6', which has a configuration similar to that of the receiver circuit 6 shown in FIG. 1, and a D-type flip-flop circuit 4 connected to the equivalent receiver circuit 6'.

Input signals from pins P2 and N2 of the time-axis expanding circuit 3 are inputted to the gates of CMOS transistors M4 and M3 of the equivalent receiver circuit 6', and, in the same manner as that in the receiver circuit 6 shown in FIG. 1, equivalent differential receiving signals (P3/N3) outputted from the drains of the CMOS transistors M3 and M4 are inputted to the D input terminal of the D-type flip-flop circuit 4. A measuring clock signal CK1 is inputted to the clock input terminal of the D-type flip-flop circuit 4, and a time-axis-expanded signal VEPD is outputted from the Q output terminal of the D-type flip-flop circuit 4 to a pin VEPD of the time-axis expanding circuit 3.

Figure 3:
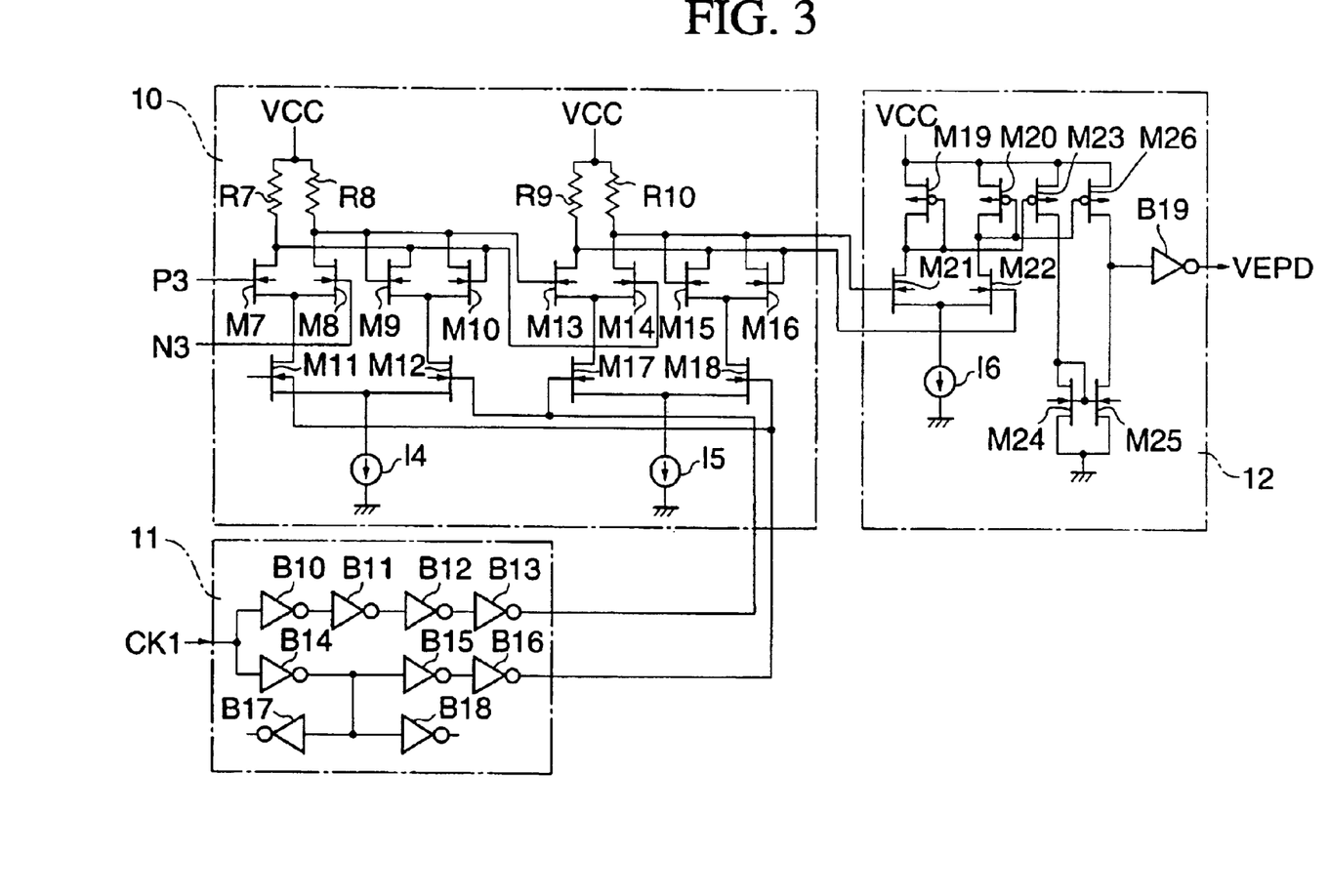
FIG. 3 is a circuit diagram showing, by way of example, the configuration of a D-type flip-flop circuit, which performs time-axis extension, shown in FIG. 2.

An example of the configuration of the D-type flip-flop circuit 4 shown in FIG. 2 is illustrated in FIG. 3. For the purpose of coping with high-speed signals, the D-type flip-flop circuit 4 includes a differential D-type flip-flop circuit 10 composed of a plurality of CMOS transistors M7 to M18 and a plurality of resistors R7 to R10, a clock differentiating circuit 11 composed of a plurality of inverters B10 to B18, and a full-swing level converter 12 composed of a plurality of CMOS transistors M19 to M26 and an inverter B19. Since the configuration of each of the differential D-type flip-flop circuit 10, the clock differentiating circuit 11 and the full-swing level converter 12 is very well known, the description thereof is omitted here. Incidentally, the differential D-type flip-flop circuit 10, the clock differentiating circuit 11 and the full-swing level converter 12 are very small in circuitry size as CMOS transistor circuits, so that the additional mounting thereof on the sending-side integrated circuit 1 poses no problem.

Time-axis Expanding Operation

The time-axis expanding operation by the D-type flip-flop circuit 4 will now be described with reference to the time charts shown in FIGS. 6(a) and 6(b).

The period To' of the clock signal CK1 to be used in the D-type flip-flop circuit 4 is set slightly different from the period To of the high-speed signal S1 to be inputted to the driver circuit 2. In FIG. 6(a), an actual high-speed signal (P2/N2, P3/N3) is shown, and the ratio of the period To' to the period To is expressed as follows:

$$To'/To = 21/20 \tag{1}$$

Figure 6A:
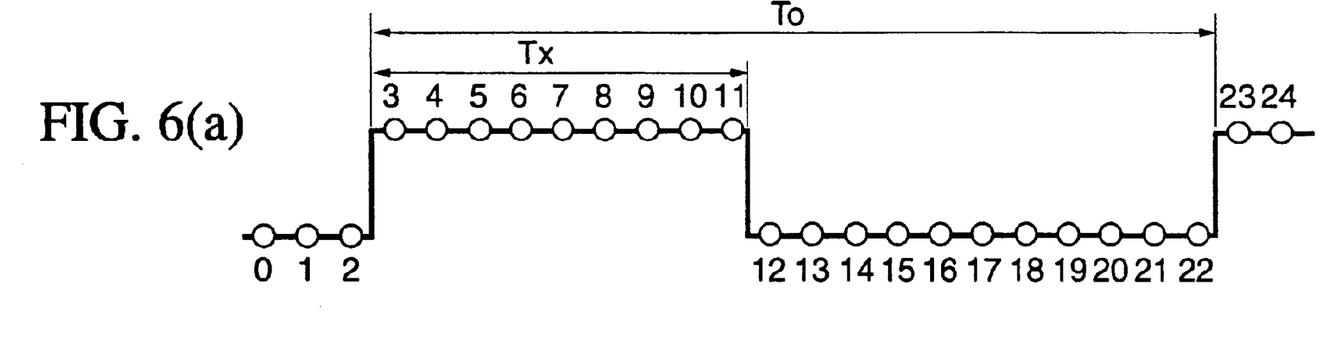
FIGS. 6(a) and 6(b) are time charts illustrating the time-axis expanding operation by the D-type flip-flop circuit shown in FIG. 3.
Figure 6B:
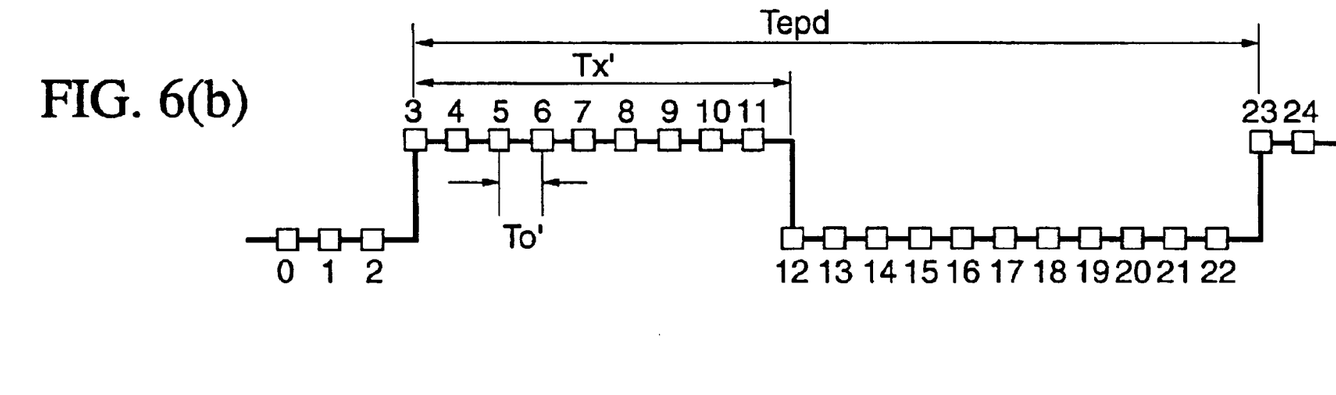

Assuming that this high-speed signal S1 is a signal having a period of a pulse width Tx during a desired period of time, logical values are sequentially sampled in such a manner that marks "○" in FIG. 6(a) represent the positions of sampling and numerals affixed to the marks "○" represent sample numbers. This sampling time interval is the period To' of the clock signal CK1. Accordingly, as shown in FIG. 6(b), a time-axis-expanded signal VEPD having a signal period Tepd, the high-speed signal period To of which has been time-axis-expanded to 20 times, is outputted from the Q output terminal of the D-type flip-flop circuit 4. The pulse width Tx is also time-axis-expanded and converted into a pulse width Tx'.

Although the time-axis-expanded signal period Tepd and the pulse width Tx' have an error of the clock period To', the following relation can be easily achieved by the use of a quartz oscillator (not shown) for generating clock signals:

$$(To'-To)/To<0.1\%  \quad (2),$$

so that it is possible to remarkably reduce the above-mentioned error.

The pulse width Tx' can be easily measured by a counter (not shown) on the basis of a clock signal having the period To or the period To'.

As a result, even when the high-speed signal S1 is an 8-bit serial converted signal, the measurement of time for 1-bit data can be accomplished with high accuracy of an error of 1% or less.

Further, by beforehand measuring the above-mentioned time-axis-expanded signal period Tepd, since the ratio "Tx'/Tepd" can be used for the measurement, it is possible to stably estimate a pulse width of a high-speed signal with high accuracy, even when the ratio "To'/To" varies due to the unevenness of integrated circuits or due to the-variation of environment.

Evaluation of Sending-side Integrated Circuit

Figure 4:
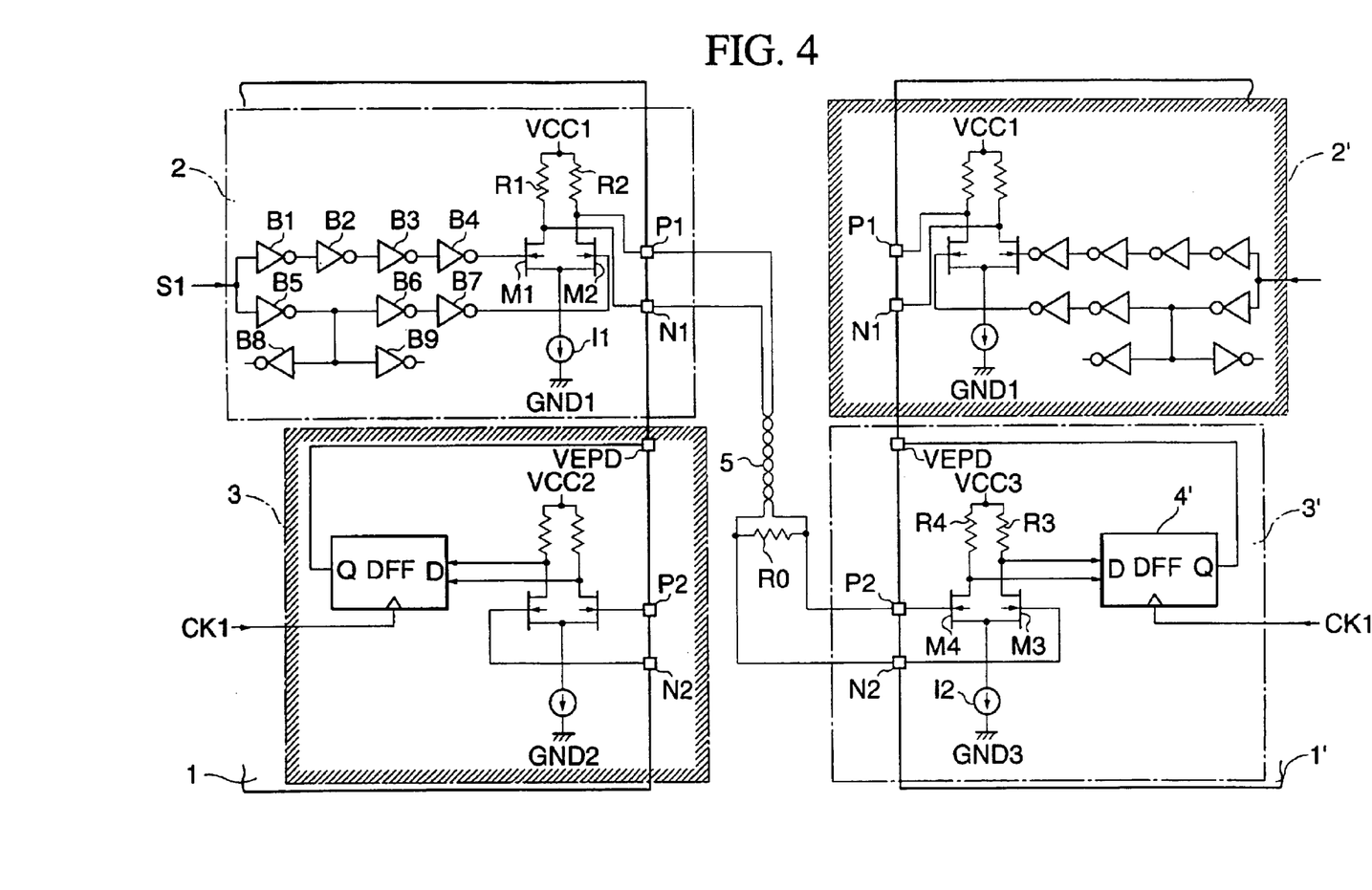
FIG. 4 is a circuit diagram showing a shipping inspection method for a sending-side integrated circuit having the configuration shown in FIG. 2.

FIG. 4 shows the shipping inspection method for the sending-side integrated circuit 1 having the configuration shown in FIG. 2, according to the embodiment of the invention. A sending-side integrated circuit 1' shown on the right side of FIG. 4 is used for inspection, and has the same configuration as that of the sending-side integrated circuit 1. The time-axis expanding circuit 3 of the integrated circuit 1 and the driver circuit 2' of the integrated circuit 1' are not used. The transmission line 5 is connected to the pins P1 and N1 of the driver circuit 2 of the integrated circuit 1 to be subjected to the shipping inspection, and the pins P2 and N2 of the time-axis expanding circuit 3'of the inspecting integrated circuit 1' are connected to the transmission line 5 via the terminal resistor R0. Incidentally, the transmission line 5 and the terminal resistor R0 should preferably comply with actual conditions of use.

When a high-speed signal (P1/N1) which has been converted into a signal of a predetermined period is outputted, during a desired period of time for measurement, from the integrated circuit 1 subjected to the shipping inspection, a time-axis-expanded signal VEPD -is outputted from the inspecting integrated circuit 1' to the terminal VEPD according to the measuring clock signal CK1 of the predetermined period To or To'. Then, the period Tepd and the pulse width Tx' of the time-axis-expanded signal VEPD are measured by a counter (not shown) on the basis of the measuring clock signal CK1.

Evaluation of Receiving-side Integrated Circuit

Figure 5:
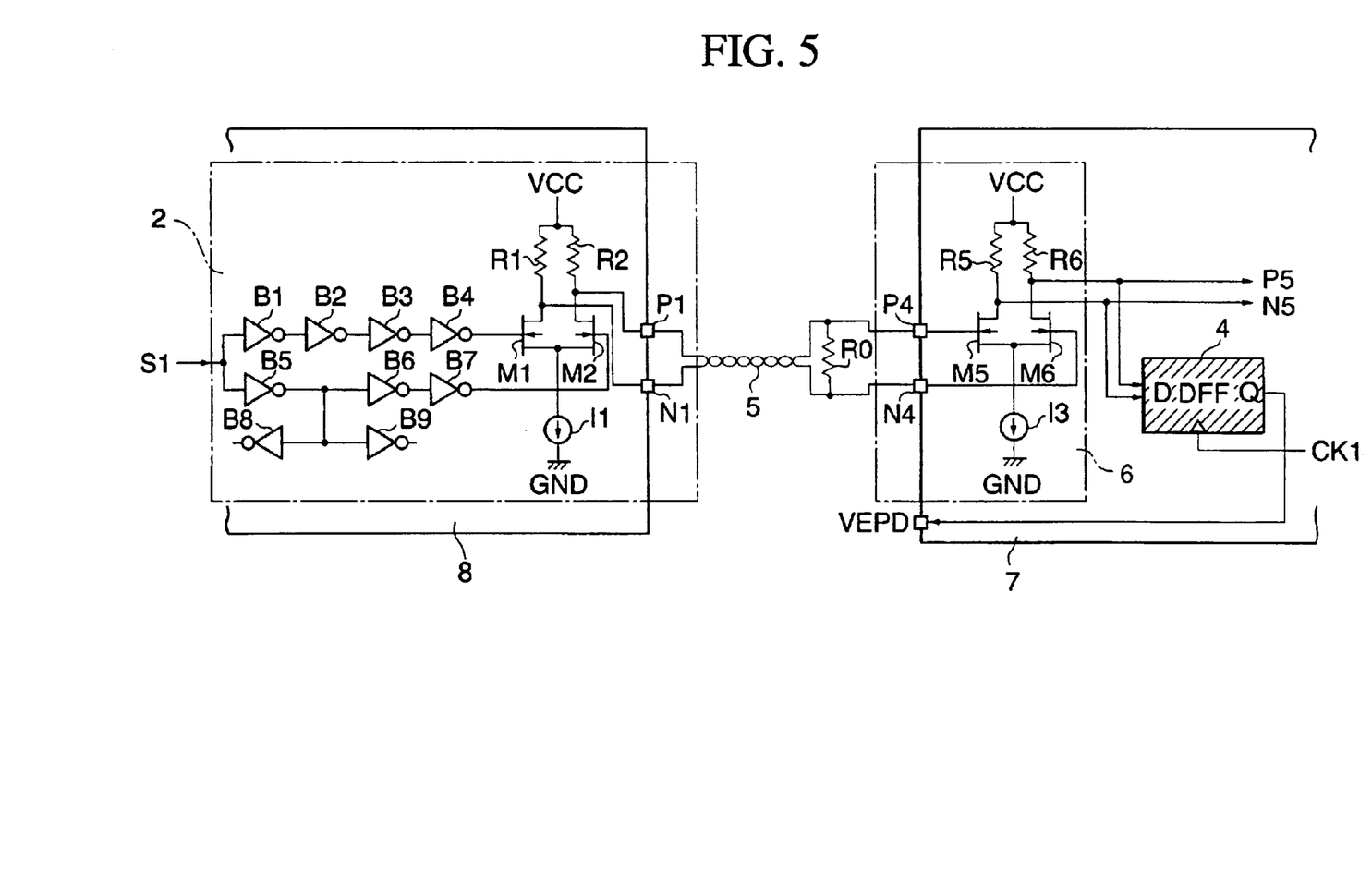
FIG. 5 is a circuit diagram showing a shipping inspection method for a receiving-side integrated circuit.

FIG. 5 shows the shipping inspection method for a receiving-side integrated circuit 7 according to the embodiment of the invention. The receiving-side integrated circuit 7 has a receiver circuit 6 of the same configuration as in the conventional integrated circuit shown in FIG. 1, and in addition, a D-type flip-flop circuit 4 for time-axis expansion. As shown in FIG. 5, the lines for the differential receiving signals P5 and N5 of the receiver circuit 6 are connected to the D input terminal of the D-type flip-flop circuit 4. The D-type flip-flop circuit 4 has the same configuration as that shown in FIG. 3. Incidentally, although in the embodiment of the invention the sending-side integrated circuit 8 has the same configuration as that of the conventional integrated circuit shown in FIG. 1, it goes without saying that the sending-side integrated circuit 1 having the configuration shown in FIG. 2 according to the embodiment may be used.

Then, high-speed signals are transmitted by the sending-side integrated circuit 8, the transmission line 5, and the terminal resistor R0, and are then inputted to the receiving-side integrated circuit 7 subjected to the shipping inspection. The receiving signals (P5/N5) outputted from the receiver circuit 6 of the receiving-side integrated circuit 7 are inputted to the D input terminal of the D-type flip-flop circuit 4. The measuring clock signal CK1 of the predetermined period To or To' is inputted to the clock input terminal of the D-type flip-flop circuit 4. Then, the time-axis-expanded signal VEPD is outputted from the Q output terminal of the D-type flip-flop circuit 4 to the terminal VEPD.

In the manner similar to that described with reference to FIG. 4, the period Tepd and the pulse width Tx' of the time-axis-expanded signal VEPD are measured by a counter (not shown) on the basis of the measuring clock signal CK1.

In the above-mentioned embodiment, the transmission of high-speed signals between integrated circuits has been explained with differential signal transmission. It is, however, apparent that it is possible to build a similar system also in TTL (transistor-transistor logical circuit) and CMOS transistor full-swing single-phase signal transmission, which is generally put into practice.

As has been described in the foregoing, according to the embodiment of the invention, in an integrated circuit which is arranged to send and receive high-speed signals and whose action is difficult to confirm, the simplification of evaluation of ICs is achieved without leading to a cost increase for the integrated circuits, by additionally mounting a time-axis expanding circuit of a simple configuration in the integrated circuit.

Further, according to the embodiment of the invention, the user of integrated circuits can conduct stable and high-accuracy measurement without the need for an expensive measuring instrument or probing.

In addition, according to the embodiment of the invention, it is possible for the user of integrated circuits to optimize a transmission line and a terminal resistor thereof with ease.

What is claimed is:

1. An integrated circuit, comprising
   a driver circuit for outputting a signal sent from the inside of said integrated circuit to the outside of said integrated circuit;
   a receiver circuit for receiving a signal from the outside of said integrated circuit;
   a time-axis expanding circuit for time-axis-expanding an output signal of said receiver circuit; and
   a terminal for outputting a signal time-axis-expanded by said time-axis expanding circuit to the outside of said integrated circuit.

2. An integrated circuit according to claim 1, wherein said time-axis expanding circuit has a D-type flip-flop circuit.

3. An integrated circuit according to claim 2, wherein said D-type flip-flop circuit is a CMOS transistor circuit including a differential D-type flip-flop circuit, a clock differentiating circuit and a fill-swing level converter.

4. An integrated circuit according to claim 2, wherein said D-type flip-flop circuit uses a clock signal having a period different, by a predetermined minute time, from a period of an input signal inputted to said driver circuit, and generates a time-axis-expanded pulse signal having an expanded time axis while keeping a duty ratio of said input signal.

5. An integrated circuit according to claim 3, wherein said D-type flip-flop circuit uses a clock signal having a period different, by a predetermined minute time, from a period of an input signal inputted to said driver circuit, and generates a time-axis-expanded pulse signal having an expanded time axis while keeping a duty ratio of said input signal.

6. An evaluation method of evaluating a sending-side integrated circuit, said evaluation method comprising the steps of:

preparing an inspecting integrated circuit including a first driver circuit for outputting a signal outside, a first receiver circuit for receiving a signal from outside, and a first time-axis expanding circuit for time-axis-expanding an output signal of the first receiver circuit, and an inspected integrated circuit including a second driver circuit having the same configuration as that of the first driver circuit, a second receiver circuit having the same configuration as that of the first receiver circuit, and a second time-axis expanding circuit having the same configuration as that of the first time-axis expanding circuit;

connecting the first driver circuit of the inspecting integrated circuit to the second receiver circuit of the inspected integrated circuit by a transmission line and a terminal transistor;

inputting a signal to the first driver circuit of the inspecting integrated circuit; and measuring a time-axis-expanded signal outputted from the second time-axis expanding circuit of the inspected integrated circuit, on the basis of a measuring clock signal having a predetermined period, with a counter.

7. An evaluation method of evaluating a receiving-side integrated circuit, said evaluation method comprising the steps of:

preparing an inspected driver circuit of an integrated circuit for outputting a signal outside, and an inspecting integrated circuit including a receiver circuit for receiving a signal from outside, and a time-axis expanding circuit for time-axis-expanding an output signal of the receiver circuit;

connecting the driver circuit to the receiver circuit of the inspecting integrated circuit by a transmission line and a terminal resistor;

inputting a signal to the driver circuit; and measuring a time-axis-expanded signal outputted from the time-axis expanding circuit of the inspecting integrated circuit, on the basis of a measuring clock signal having a predetermined period, with a counter.

* * * * *